United States Patent
Cui et al.

(10) Patent No.: US 11,307,491 B2
(45) Date of Patent: Apr. 19, 2022

(54) MASK, MASK ASSEMBLY, EXPOSURE MACHINE, METHOD FOR TESTING SHADOWING EFFECT ON WINDOW, AND PHOTOLITHOGRAPHY METHOD

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Jiabin Cui, Beijing (CN); Li Wang, Beijing (CN); Zhibin Li, Beijing (CN); Pengfei Liang, Beijing (CN); Chang Liu, Beijing (CN); Peng Chen, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 903 days.

(21) Appl. No.: 16/069,769

(22) PCT Filed: Dec. 8, 2017

(86) PCT No.: PCT/CN2017/115267
§ 371 (c)(1),
(2) Date: Jul. 12, 2018

(87) PCT Pub. No.: WO2018/205588
PCT Pub. Date: Nov. 15, 2018

(65) Prior Publication Data
US 2021/0216006 A1    Jul. 15, 2021

(30) Foreign Application Priority Data
May 10, 2017   (CN) .......................... 201710326143.5

(51) Int. Cl.
*G03F 1/44*    (2012.01)
*G03F 7/20*    (2006.01)

(52) U.S. Cl.
CPC .............. *G03F 1/44* (2013.01); *G03F 7/7065* (2013.01); *G03F 7/7085* (2013.01)

(58) Field of Classification Search
CPC ..... G03F 1/44; G03F 1/38; G03F 1/42; G03F 1/68; G03F 1/82; G03F 1/84;
(Continued)

(56) References Cited

U.S. PATENT DOCUMENTS 5,272,501 A * 12/1993 Nishi .................... G03F 9/7049
355/43
2003/0232253 A1* 12/2003 Leroux .............. G01N 23/2251
430/5
(Continued)

FOREIGN PATENT DOCUMENTS

CN    103869603 A    6/2014
CN    103995433 A    8/2014
(Continued)

OTHER PUBLICATIONS

International Search Report and Written Opinion dated Mar. 7, 2018; PCT/CN2017/115267.

*Primary Examiner* — Christina A Riddle

(57) ABSTRACT

A mask, a mask assembly, an exposure machine, a method for testing shadowing effect on a window, and a photolithography method are provided. The mask includes a light transmission area; a functional window provided at a side of the light transmission area; and at least one of a first detection mark and a second detection mark; wherein the first detection mark is flushed with a border of the functional window adjacent to an interior of the mask; and the second
(Continued)

detection mark is disposed between the profile of the light transmission area and the functional window.

17 Claims, 6 Drawing Sheets

(58) Field of Classification Search
CPC .............. G03F 7/7085; G03F 7/7065; G03F 7/70616–70683; G03F 7/70975; G03F 7/70983; G03F 7/70991; G03F 9/7073; G03F 9/7076; G03F 9/7088; G03F 7/0005; G03F 7/0007; G03F 7/2022; G03F 7/70466; G03F 7/70916; G03F 7/70941; G03F 7/70425; G03F 7/70475; G03F 1/50; G02F 1/133514; G02F 1/133516; G02F 1/133354; G02F 1/1303
USPC .... 430/5, 22, 30; 355/18, 46, 52–55, 67–71, 355/72–77, 133; 438/166, 404, 308
See application file for complete search history.

(56) References Cited

U.S. PATENT DOCUMENTS

| | | | |
|---|---|---|---|
| 2004/0029028 A1* | 2/2004 | Shimizu | G01B 11/0608 430/30 |
| 2008/0096113 A1 | 4/2008 | Naoe | |
| 2009/0195764 A1* | 8/2009 | Takenaka | G03F 7/706 355/53 |
| 2012/0082938 A1* | 4/2012 | Fabinski | G03F 7/70633 430/312 |
| 2012/0141926 A1* | 6/2012 | Zhang | G03F 1/00 430/5 |
| 2015/0331310 A1 | 11/2015 | Wei et al. | |
| 2017/0192143 A1* | 7/2017 | Xiong | G02B 5/201 |

FOREIGN PATENT DOCUMENTS

| | | | | |
|---|---|---|---|---|
| CN | 104297989 A | | 1/2015 | |
| CN | 105487333 A | * | 4/2016 | ............ G02B 27/32 |
| CN | 106569395 A | | 4/2017 | |
| CN | 106610564 A | | 5/2017 | |
| CN | 106933025 A | | 7/2017 | |

* cited by examiner

MASK, MASK ASSEMBLY, EXPOSURE MACHINE, METHOD FOR TESTING SHADOWING EFFECT ON WINDOW, AND PHOTOLITHOGRAPHY METHOD

TECHNICAL FIELD

At least one embodiment of the present disclosure relates to a mask, a mask assembly, an exposure machine, a method for testing shadowing effect on a window, and a photolithography method.

BACKGROUND

A color filter (CF) is a key component of a display device such as an LCD (Liquid Crystal Display) for color display. The performance of the color filter (such as aperture ratio, color purity, color difference, etc.) directly affects the color reproduction, brightness, and contrast of the liquid crystal display. At present, a color filter comprises, for example, a glass substrate, a BM (Black Matrix), a color photoresist (RGB), an overcoat (OC), an ITO (Indium Tin Oxides) transparent conductive film, and the like.

SUMMARY

At least one embodiment of the present disclosure provides a mask comprising: a light transmission area; a functional window provided at a side of the light transmission area; and at least one of a first detection mark and a second detection mark; wherein the first detection mark is flushed with a border of the functional window adjacent to an interior of the mask; and the second detection mark is disposed between the profile of the light transmission area and the functional window.

For example, in the mask according to at least one embodiment of the present disclosure, the functional window comprises at least one of an alignment mark window and a gap window.

For example, in the mask according to at least one embodiment of the present disclosure, the first detection mark is disposed at a side of the alignment mark window and/or the gap window.

For example, in the mask according to at least one embodiment of the present disclosure, the first detection mark comprises a first sub-mark and a second sub-mark; the first sub-mark is disposed at a side of the alignment mark window; and the second sub-mark is disposed at a side of the gap window.

For example, in the mask according to at least one embodiment of the present disclosure, the second detection mark comprise a third sub-mark and a fourth sub-mark; the third sub-mark is disposed between a profile of the light transmission area and the alignment mark window; and the fourth sub-mark is disposed between a profile of the light transmission area and the gap window.

For example, in the mask according to at least one embodiment of the present disclosure, the mask comprises a plurality of second detection marks, an overall pattern formed by the plurality of second detection marks has a strip shape and have a length greater than the distance between the two side edges of the alignment mark window and the gap window which are away from each other.

For example, in the mask according to at least one embodiment of the present disclosure, the mask comprise a plurality of second detection marks, an overall pattern formed by the plurality of second detection marks has a strip shape and have a length greater than a length of the profile of the light transmission area.

For example, in the mask according to at least one embodiment of the present disclosure, a width of the overall pattern formed by the plurality of second detection marks is less than a distance a border of the profile of the light transmission area of the mask facing the edge of the alignment mark window and an edge of the alignment mark window facing the profile of the light transmission area, and/or, a width of the overall pattern formed by the plurality of second detection marks is less than a distance of a border of the profile of the light transmission area of the mask facing the gap window and an edge of the gap window facing the profile of the light transmission area.

At least one embodiments of the present disclosure provided a mask assembly comprising a plurality of any one masks as described above.

For example, in the mask assembly according to at least one embodiment of the present disclosure, the plurality of the masks comprises two, three or four masks for respectively forming two, three or four of a red color layer, a green color layer, a blue color layer and a spacer; the first detection marks comprises two, three or four of a first red detection mark, a first green detection mark, a first blue detection mark and a first spacer detection mark; the two, the three or the four of the first red detection mark, the first green detection mark, the first blue detection mark and the first spacer detection mark are disposed on different masks of the mask assembly, respectively; and positions of the two, the three or the four of the first red detection mark, the first green detection mark, the first blue detection mark and the first spacer detection mark on the respective masks are different from each other.

For example, in the mask assembly according to at least one embodiment of the present disclosure, the second detection mark of the plurality of the masks comprises two, three or four of a second red detection mark, a second green detection mark, a second blue detection mark, and a second spacer detection mark; the two, the three or the four of the second red detection mark, the second green detection mark, the second blue detection mark, and the second spacer detection mark are respectively disposed on different masks of the mask assembly; and positions of the two, the three or the four of the second red detection mark, the second green detection mark, the second blue detection mark and the second spacer detection mark on the respective masks are different from each other.

For example, in the mask assembly according to at least one embodiment of the present disclosure, a number of each of the two, the three or the four of the second red detection mark, the second green detection mark, the second blue detection mark, and the second spacer detection mark are plural.

For example, in the mask assembly according to at least one embodiment of the present disclosure, the plurality of second red detection marks are arranged at equal intervals, and a distance between the two farthest second red detection marks is greater than a distance between the two side edges of the alignment mark window and the gap window which are away from each other; the plurality of second green detection marks are arranged at equal intervals, and a distance between the two farthest second green detection marks is greater than the distance between the two side edges of the alignment mark window and the gap window which are away from each other; the plurality of second blue detection marks are arranged at equal intervals, and a distance between the two farthest second green detection marks is greater than the distance between the two side edges of the alignment mark window and the gap window which are away from each other; and the plurality of second spacer detection mark are arranged at equal intervals, and a distance between the two farthest second spacer detection mark is greater than the distance between the two side edges of the alignment mark window and the gap window which are away from each other.

At least one embodiment of the present disclosure provides a method for testing shadowing effect on a window through any one of the masks as described above or through any one of the mask assemblies as described above, the method comprising optically inspecting a substrate to determine whether a first mark or a second mark is formed on the substrate by the first detection mark or the second detection mark.

For example, in the method for testing shadowing effect on window according to at least one embodiment of the present disclosure, when the first mark is formed on the substrate by the first detection mark, it is determined that a first shadowing defect occurs; and when the second mark formed on a substrate of a color filter by the second detection mark is incomplete, it is determined that a second shadowing defect occurs.

For example, the method for testing shadowing effect on window according to at least one embodiment of the present disclosure further comprises preparing one or more of a red color layer, a green color layer, a blue color layer and a spacer layer of the color filter through the mask or the mask assembly; and performing an optical inspection on the substrate of the color filter.

For example, in the method for testing shadowing effect on window according to at least one embodiment of the present disclosure, the optical inspection is automatic optical inspection.

At least one embodiment of the present disclosure provides an exposure machine, which adopts any one of the masks as described above or any one of the mask assemblies as described above.

At least one embodiment of the present disclosure provides a photolithography method, comprising an exposing process, in which an exposure is performed through any one of the masks as described above or any one of the mask assemblies as described above.

BRIEF DESCRIPTION OF THE DRAWINGS

In order to clearly illustrate the technical solutions of the embodiments of the disclosure, the drawings of the embodiments will be briefly described in the following; it is obvious that the drawings described below are only related to some embodiments of the disclosure and thus are not limitative of the disclosure.

DETAILED DESCRIPTION

Figure 1:
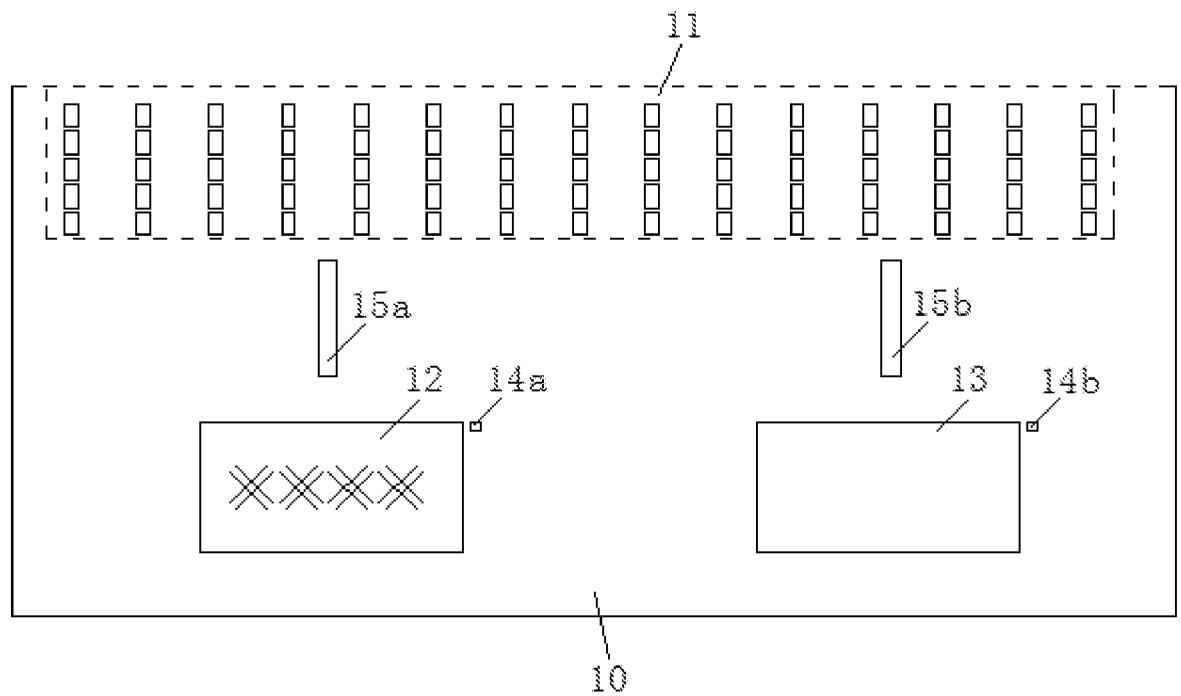
FIG. 1 is a schematic structural top view of a first example of a mask according to an example of the present disclosure.

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms used herein should have the same meaning as commonly understood by one of ordinary skill in the art. The terms "first", "second" and similar words used in the present disclosure do not denote any order, quantity, or importance, but are merely intended to distinguish different components. Words like "including" or "comprising" and etc. mean that an element or an article before them contains an element/ elements or an article/articles listed thereafter, while not excluding other elements or articles. Words such as "connect" or "couple" or the like are not to be limited to physical or mechanical connections, but may include electrical connections, either direct or indirect. Terms of "up", "down", "left", "right" and etc. are merely intended to indicate relative positional relationships. If the absolute position of the described object is changed, the relative positional relationship will be changed accordingly.

In general, when the exposure machine performs an exposure process in manufacturing a colored color layer, for example, a gap window configured to control gap and an alignment mark window configured for alignment can be shadowed by a shade, so as to prevent it from being continuously exposed in multiple processes.

However, the inventors of the present disclosure have found that there are the following problems in the preparing processes for the Color Filter.

1, In the preparation processes for structures such as color layers of various colors and spacers (R/G/B/PS), due to the presence of certain instability of the shade of the exposure machine, the alignment mark window and/or the gap window are/is not well-shadowed (for example, the window is not completely shadowed by the shade), causing photoresist residual (PR glue) remained on positions on a substrate corresponding to the alignment mark window and/or the gap window. The PR glue residual has a certain height, so each functional layer formed thereafter will be superimposed on the PR glue residual, thus causing a defect that liquid crystal leakage occurs after the display panel is cell-assembled.

2, In the preparing processes for structures such as R/G/B/PS, due to the existence of certain instability of the shade of the exposure machine, the alignment mark window and/or the gap window are/is often over shadowed (for example, the shade being too close to the viewing area), such that a pattern size (critical dimension, CD) becomes smaller within the viewing area, resulting in a problem of the RGB pattern size and the PS pattern size being too small.

Exposure and development are indispensable for various processes for fabricating color filters (CF), and for example, can be performed through photolithography. The photolithography is mainly to use an exposure machine to project patterns in the mask onto the RGB layer on the glass substrate, and then the patterns in the mask are reproduced on the glass substrate by a developing machine.

For example, when CF is produced by a pigment dispersion method, preparing a BML (Black Matrix Layer) is the first step of the processes for CF. In preparing the BML process, after the glass substrate comes out of a washing machine, BM material is first coated on the glass substrate by a coating machine, and the glass substrate coated with the BM material is pre-baked (Prebake) and then is exposed by an exposure machine. The role of the exposure machine in this process is: (1) forming a BM layer on the glass substrate; (2) forming various marks on the glass substrate, comprising RGB marks for alignment, in which the RGB marks correspond to the alignment marks in the alignment mark window in the mask.

Subsequently, color layers of R, G, and B are formed on the substrate on which the BML is formed, and the color layers can be made of for example, colored resin materials. For example, the R, G, and B color layers are made of red, green, and blue resin materials, respectively, so that the light is filtered, and only red, green, and blue light are allowed to pass therethrough. The operation of the exposure machine will be described by taking a Proximity exposure machine as an example. The operation of the exposure machine usually comprises Pre-alignment, Gap Control, Alignment, and Exposure in sequence.

For example, the gap of the exposed portion (the distance between the lower surface of the mask and the upper surface of the glass substrate) can be adjusted by a gap control, for example, the gap is determined by a gap sensor through identifying a reflected signal from the gap window in the mask.

Subsequently, precise positioning is performed, for example, before exposure for the exposed portion, for example, by using the RGB marks that are formed when preparing the BML. For example, the RGB marks in the alignment mark window on the mask can be aligned with the RGB marks on the glass substrate before the exposure machine performing each exposure so as to avoid slight angle or position deviation between the substrate, the mask, and a light source due to movement or gap control.

For example, when the exposure device performs exposure, if the gap window and the alignment mark window are not shadowed by shades during the exposure by the exposure machine, the gap window configured for control gap and the alignment mark window configured for alignment in the mask will be continuously exposed during preparing the RGB color filters and the PS (pillar spacers). As the glass substrate is usually coated with negative PR glue, along with preparing the RGB color filters, continuously exposing will cause patterns of the gap window and the alignment mark formed on the glass substrate when forming the BML overlapped again and again, thereby affecting alignments in the subsequent preparing processes and final bonding of the CF substrate and the TFT (Thin Film Transistor) substrate.

Therefore, when the exposure machine performing exposure, for example, a shade can be adopted to shadow the gap window and the alignment mark test window.

At least one embodiment of the present disclosure provides a mask that can be configured to monitor occurrence of defect. The mask comprises: a light transmission area, a function window disposed on a side of the light transmission area, and at least one of a first detection mark and a second detection mark; wherein the first detection mark is flushed with a border of the function window adjacent to an interior of the mask; the second detection mark is disposed between a profile of the light transmission area and the function window.

In at least one embodiment of the present disclosure, the light transmission area of the mask corresponds to a main pattern that is desired to be formed in the manufacturing process (excluding auxiliary patterns configured for alignment, gap measurement, and etc.), for example, including multiple light transmission units, for example, configured to form a pattern of each functional layer pattern of a pixel array in a display panel.

For example, FIG. 1 is a schematic structural view of a first example of the mask provided by an embodiment of the present disclosure. In FIG. 1, portions outside of the uppermost dashed line refer to other structures of the mask which is not shown, for example, are other portions of the mask which are not shown.

As illustrated in FIG. 1, the mask 10 according to the embodiment comprises function windows. These function windows are configured to prepare auxiliary patterns other than the main pattern, for example, comprising the alignment mark window 12 and the gap window 13. For example, the mask 10 further comprises at least one of a first detection marks 14*a*/14*b* and a second detection marks 15*a*/15*b*.

For example, the first detection mark 14*a*/14*b* is flushed with the border of the alignment mark window 12 and/or the gap window 13 adjacent to the inside of the mask 10. It should be noted that the term "flushed with" here can refer to, for example, the edge of the first detection mark 14*a*/14*b* adjacent to the inside of the mask 10 and border of the alignment mark window 12 and/or the gap window 13 adjacent to the interior of the mask 10 are in a same horizontal line. Of course, this is only illustrative. From the following description, it can be seen that the edges of the first detection marks 14*a*/14*b* adjacent to the interior of the mask 10 are not necessarily in a same horizontal line as the border of the alignment mark window 12 and/or the gap window 13 adjacent to the interior of the mask 10, and the first detection mark 14*a*/14*b* can work properly as long as the edge of the first detection mark 14*a*/14*b* is in proximity of the line where the border of the alignment mark window 12 and/or the gap window 13 adjacent to the interior of the mask 10 is located. Additionally, if the size of the first detection mark 14*a*/14*b* is negligible with respect to the size of the alignment mark window 12 and/or the gap window 13, it is not required to define which edge of the first detection mark 14*a*/14*b* is flushed with the border of the align mark window 12 and/or the gap window 13 adjacent to the interior of the mask 10.

With reference to FIG. 1, it can be seen that the mask 10 according to this embodiment can comprise a plurality of detection marks. For example, the mask 10 can only comprise a first detection mark 14a disposed only on the side of the alignment mark window 12, or the mask 10 can only comprise s first detection mark 14b disposed on the side of the gap window 13, or the mask 10 can further comprise only a second detection 15a disposed between the profile of the light transmission area 11 and the alignment mark window 12, or the mask 10 can further comprise only a second detection 15b disposed between the profile of the light transmission area 11 and the gap window 13, or the mask can comprise two, three or all of the detection marks mentioned above according to actual requirements.

For example, as illustrated in FIG. 1, the first detection mark 14a/14b is flushed with the border of the alignment mark window 12 and/or the gap window 13 adjacent to the interior of the mask 10 (that is, the border of the alignment mark window 12 and/or the gap window 13 adjacent to the profile of the light transmission area 11, for example, the upper border of the alignment mark window 12 and/or the gap window 13 as illustrated in FIG. 1). For example, the first detection mark 14a/14b is disposed on the side of the alignment mark window 12 and/or the gap window 13, and can be shadowed by the first shade 21 under normal conditions, so as to provide an effect of a shade shadowing the test windows.

For example, as illustrated in FIG. 1, the first detection mark comprises a first sub-mark 14a and a second sub-mark 14b; the first sub-mark 14a is disposed at a side of the alignment mark window 12; and the second sub-mark 14b is disposed at a side of the gap window 13 so that the shadowing effect of the alignment mark window 12 and the gap window 13 can be simultaneously detected. It should be noted that FIG. 1 illustrates that the first sub-mark 14a is disposed on the right side of the alignment mark window 12 and the second sub-mark 14b is disposed on the right side of the gap window 13. In fact, for example, the sub-mark 14a can be provided on the left side of the alignment mark window 12, and the second sub-mark 14b can be provided on the left side of the gap window 13, for example. That is, the first sub-mark 14a and the second sub-mark 14b are not required to be provided on the same side of the alignment mark window 12 and the gap window 13.

For example, the second detection mark 15a/15b can be disposed between a profile of the light transmission region 11 of the mask 10 and the alignment mark window 12, and/or the second detection mark 15a/15b can also be disposed between the profile of the light transmission area of the mask 10 and the gap window 13. For example, the second detection mark comprises a third sub-mark 15a and a fourth sub-mark 15b. The third sub-mark 15a is disposed between the profile of the light transmission area 11 of the mask 10 and the alignment mark window 12, and the fourth sub-mark 15b is disposed between the profile of the light transmission area 11 of the mask 10 and the gap window 13.

The function of the mask 10 in testing the shadowing effect on the windows will be described in conjunction with a method of testing the shadowing effect on the windows by the mask 10.

Hereinafter, the mask 10 will be described by taking it having the first sub-mark 14a, the second sub-mark 14b, the third sub-mark 15a, and the fourth sub-mark 15b as an example.

Figure 2A:
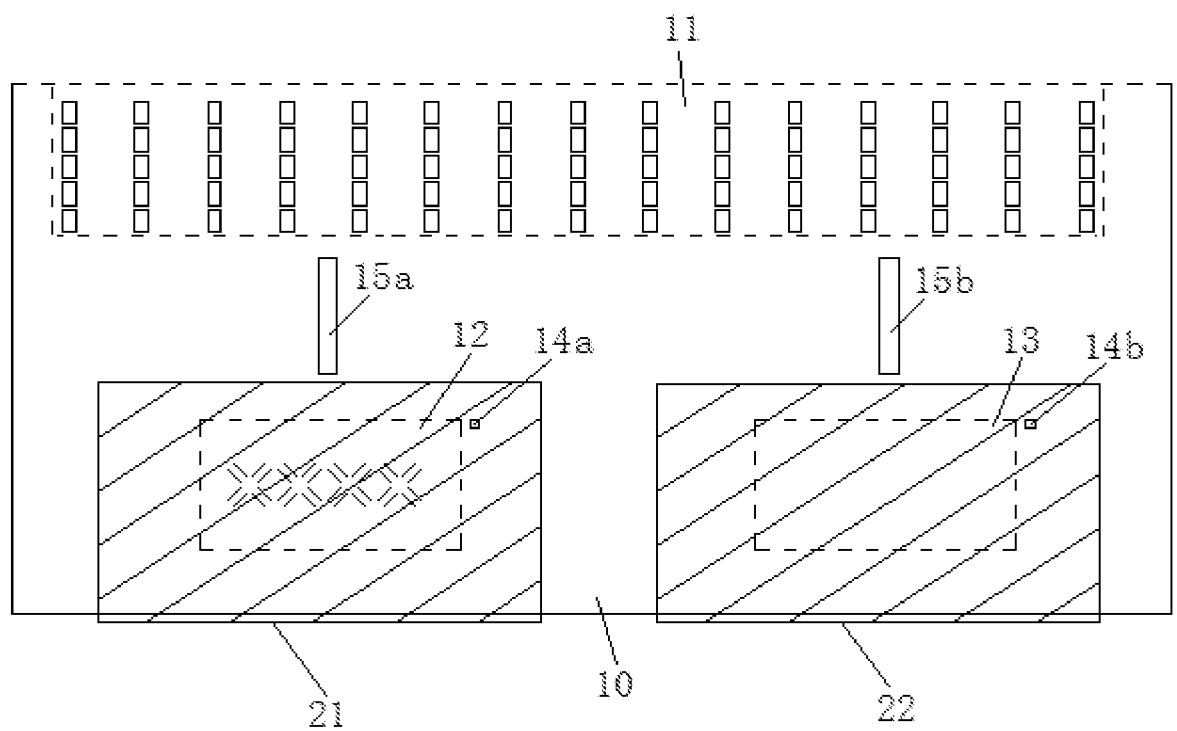
FIG. 2A is a schematic top view of a test window of a first example of a mask according to an embodiment of the present disclosure shadowed by a shade appropriately.
Figure 3A:
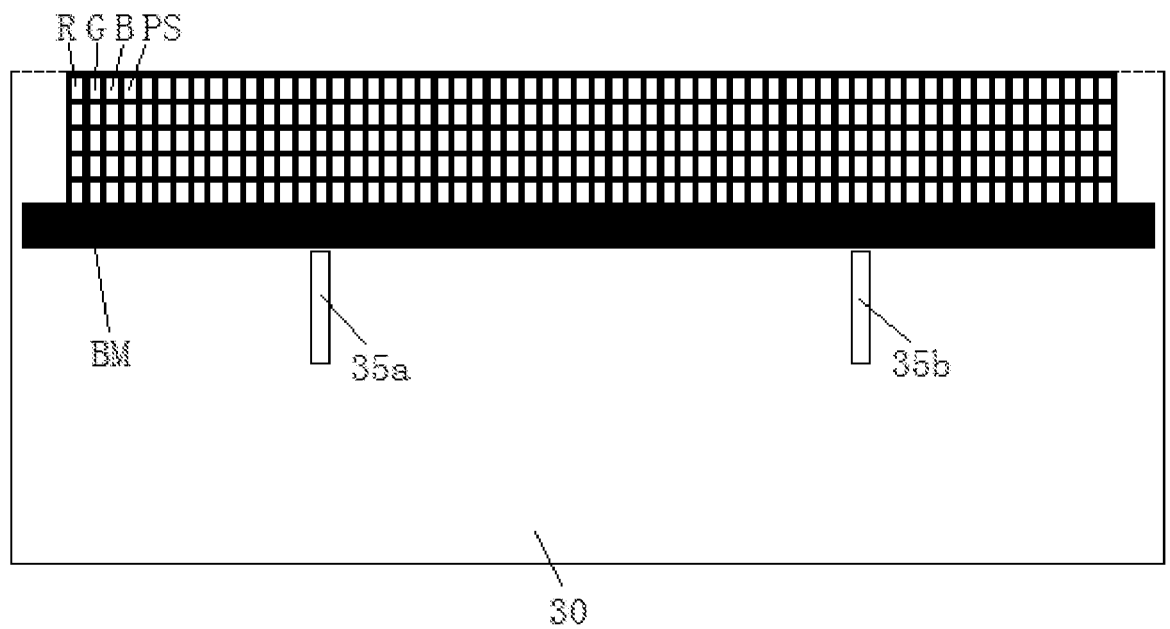
FIG. 3A is a schematic structural top view of a substrate of a color filter shaded by a shade in the position as illustrated in FIG. 2A.

For example, as illustrated in FIG. 2A, the first shade 21 configured to shadow the alignment mark window 12 is placed in a suitable position and can shadow the alignment mark window 12, and the second shade 22 configured to shadow the gap window 13 is placed in a suitable position and can shadow the gap window 13. In this case, the first sub-mark 14a and the second sub-mark 14b are completely shadowed by the first shade 21 and the second shade 22, respectively, and the third sub-mark 15a and the fourth sub-mark 15b are completely not shadowed by the first shade 21 and the second shade 22. In any one of preparing process for the red coloring layer R, the green coloring layer G, the blue coloring layer B, and the spacer layer PS on the black matrix layer BM of the color filter, after the exposure process, a substrate 30 of the color filter is in the state as illustrated in FIG. 3A. It can be seen that, because of the exposure process, the third sub-mark 15a and the fourth sub-mark 15b are not shadowed by the first shade 21 and the second shade 22, and corresponding second marks 35a and 35b are formed on the substrate 30; and because the first sub-mark 14a and the second sub-mark 14b are completely shadowed by the first shade 21 and the second shade 22, respectively, no first marks corresponding to the first sub-mark 14a and the second sub-mark 14b will be formed on the substrate 30 after the exposure process (referring to 34a and 34b in FIG. 3B). Therefore, after any one of the red coloring layer R, the green coloring layer G, the blue coloring layer B, and the spacer layer PS on the black matrix layer BM of the color filter substrate is completed, the substrate is optically inspected. During the detection process, if no first marks are detected and the entire second marks 35a and 35b are detected, it indicates that both the first shade 21 which is configured to shadow the alignment mark test window 12 and the second shade 22 which is configured to shadow the gap window 13 work properly in the previous manufacturing process, and no defect occurs in shadowing.

Figure 2B:
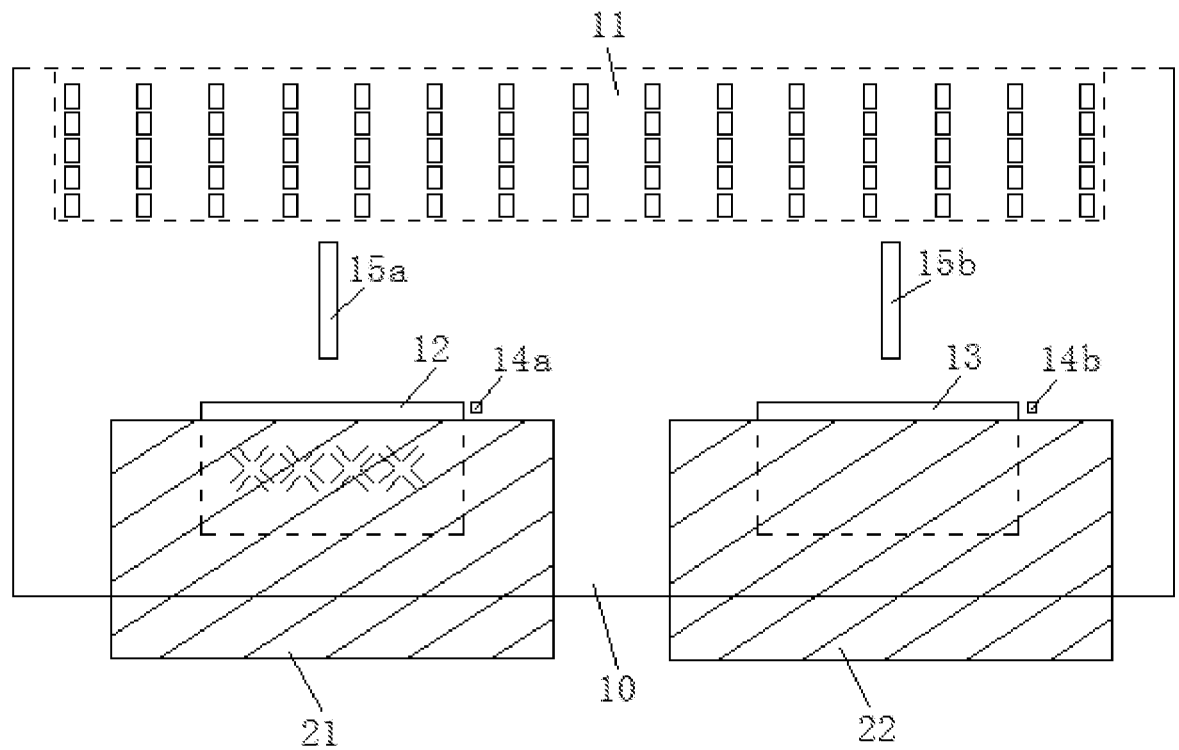
FIG. 2B is a schematic top view of a test window of a first example of a mask according to the embodiment of the present disclosure under-shadowed by a shade.
Figure 3B:
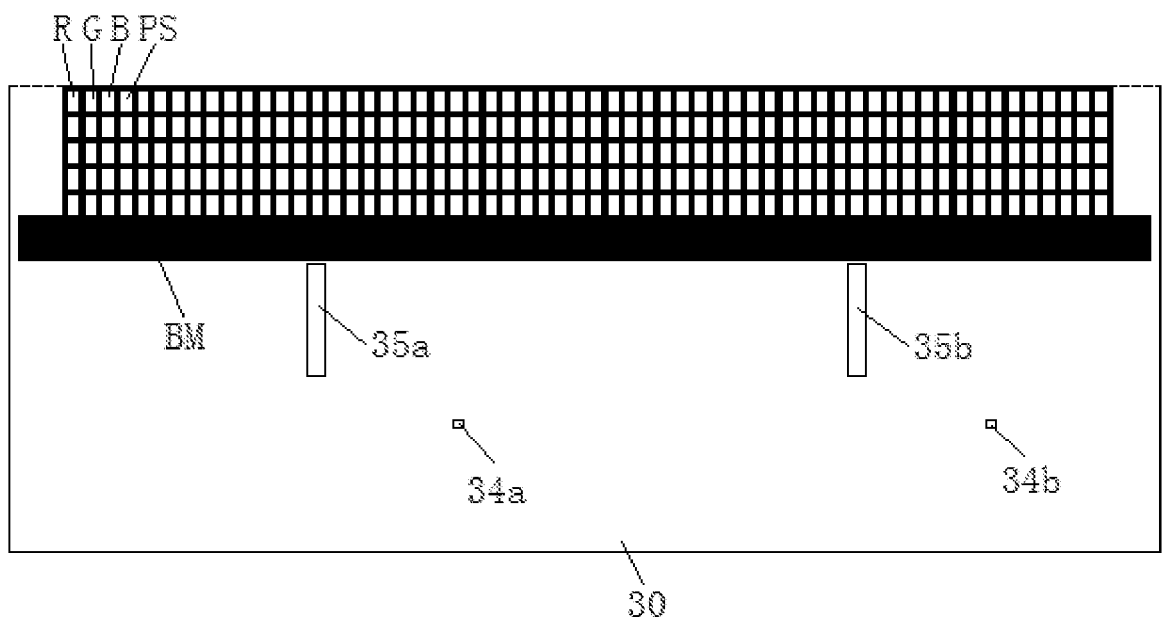
FIG. 3B is a schematic structural top view of a substrate of a color filter shaded by a shade in the position as illustrated in FIG. 2B.

For example, as illustrated in FIG. 2B, the first shade 21 configured to shadow the alignment mark window 12 does not completely shadow the alignment mark window 12 and is located closer to the outside of the mask 10 (away from the profile 11 of the light transmission area 10). And the second shade 22 configured to shadow the gap window 13 does not completely shield the gap window 13 and is located closer to the outside of the mask 10. In this case, the first sub-mark 14a and the second sub-mark 14b are not shadowed by the first shade 21 and the second shade 22, and the third sub-mark 15a and the fourth sub-mark 15b are not shadowed by the first shade 21 and the second shade 22 at all, respectively. This case can be referred to as "not completely shadowed" or "under-shadowing". In this case, in any one of the preparing processes for the red color layer R, the green color layer G, the blue color layer B, and the spacer layer PS on the black matrix layer BML on the color filter, after exposure process, the substrate 30 of the color filter then is in the state as illustrated in FIG. 3B. It can be seen that in the exposure process, as the first sub-mark 14a, the second sub-mark 14b and the third sub-mark 15a and the fourth sub-mark 15b are not shadowed by the first shade 21 and the second shade 22, corresponding first marks 34a and 34b and second marks 35a and 35b are formed on the substrate 30. Therefore, after forming any one of the red color layer R, the green color layer G, the blue color layer B, and the spacer layer PS on the black matrix layer BML on the color filter, when the substrate is optically inspected. In the detection process, it is found that the first marks 14a and 14b and the second marks 35a and 35b can be detected at the same time, which means the shadowing on the alignment marker window 12 by the first shade 21 and the shadowing on the gap window 13 by the second shade 22 are not proper, and defect of partially shadowing occurs. At that time, corresponding problems will be discovered in time if the inspection personnel monitors the optical inspection process.

Figure 2C:
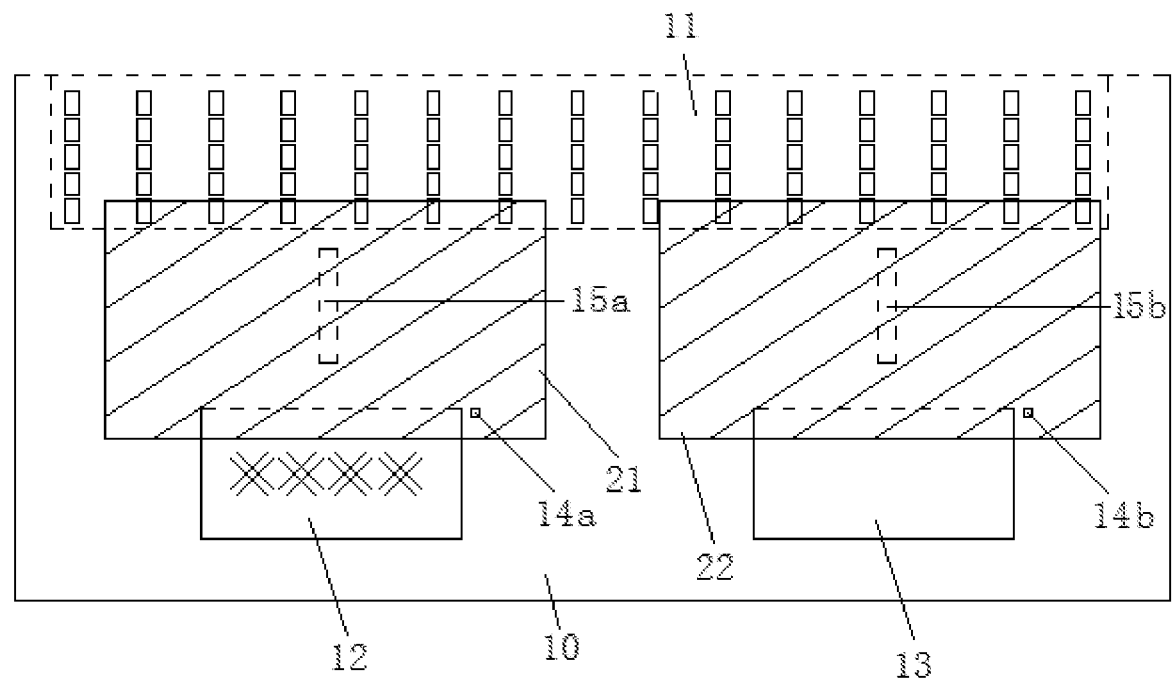
FIG. 2C is a schematic top view of a test window of a first example of a mask according to the embodiment of the present disclosure over-shadowed by a shade.
Figure 3C:
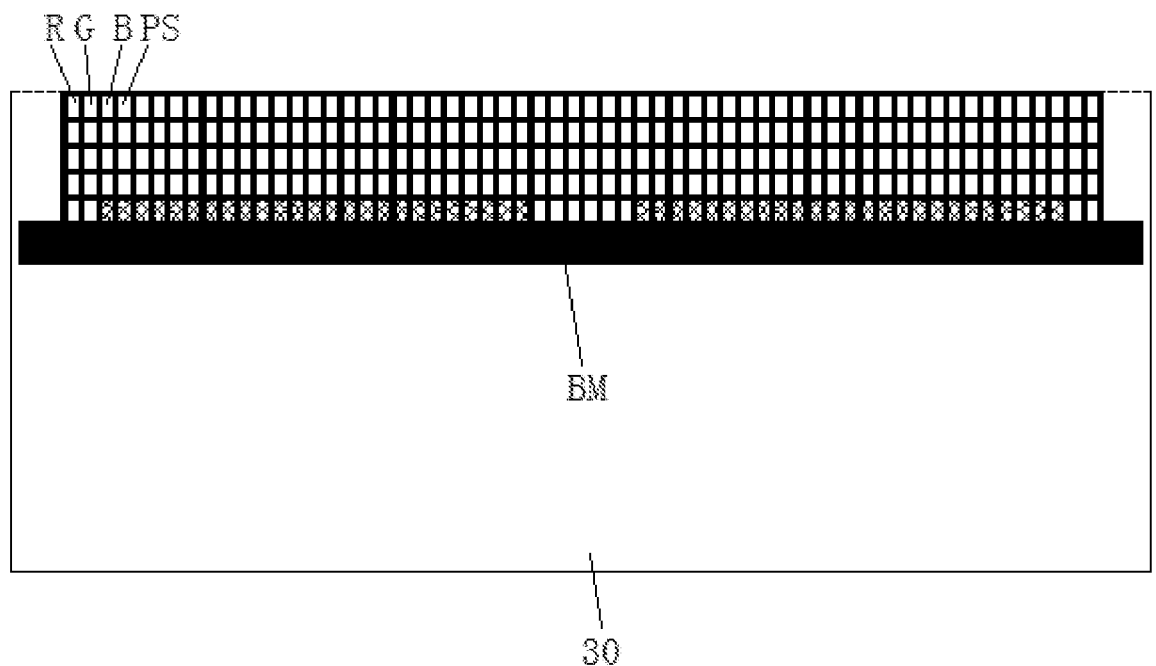
FIG. 3C is a schematic structural top view of a substrate of a color filter shaded by a shade in the position as illustrated in FIG. 2C.

For example, as illustrated in FIG. 2C, the first shade 21 configured to shadow the alignment mark window 12 does not completely block the alignment mark window 12 and is located closer to the inside of the mask 10 (closer to the profile 11 of the light transmission area), and the second shade 22 configured to shadow the gap window 13 does not completely shadow the gap window 13 and is located closer to the inside of the mask 10. In this case, the first sub-mark 14a and the second sub-mark 14b are both shadowed by the first shade 21 and the second shutter 22, respectively, and the third sub-mark 15a and the fourth sub-mark 15b are both shadowed by the first shade 21 and the second shade 22, respectively. Additionally, the profile 11 of the light transmission area of the mask 10 is also partially shadowed. This case may be referred to as "over-shadowing". In this case, in any one of the preparing processes for the red color layer R, the green color layer G, the blue color layer B, and the spacer layer PS on the black matrix layer BML on the color filter, after exposure process, the substrate 30 of the color filter then is in the state illustrated in FIG. 3C. It can be seen that, in the exposure process, as the first sub-mark 14a and the second sub-mark 14b and the third sub-mark 15a and the fourth sub-mark 15b is each shadowed by the first shade 21 and the second shade 22, and corresponding first marks 34a and 34b and corresponding second marks 35a and 35b are not formed on the substrate 30, and as the first shade 21 and the second shade 22 block a part of the profile 11 of the light transmission area, resulting in a case that pattern size in the viewing area on the substrate 30 is decreased (the hatched portion in FIG. 3 indicating a region that is not colored normally due to the shadowing by the shade). Therefore, after forming any one of the red coloring layer R, the green coloring layer G, the blue coloring layer B, and the spacer layer PS on the black matrix layer BM on the color filter, the substrate is optically inspected. During the detection process, if it is found that the first marks 14a and 14b and the second marks 35a and 35b are not detected, the shadowing on the alignment marker window 12 by the first shade 21 and the shadowing on the gap window 13 by the second shade are not proper, and a defect of over-shadowing occurs. And at this time, corresponding problems will be discovered in time if the inspection personnel monitor the optical inspection process.

It should be noted that in the above embodiment, the function of the mask 10 in testing shadowing effect on the window is described by taking the mask having the first sub-mark 14a, the second sub-mark 14b, the third sub-mark 15a and the fourth sub-mark 15b at the same time as an example, but it does not mean that the first sub-mark 14a, the second sub-mark 14b, the third sub-mark 15a and the fourth sub-mark 15b must be provided on the mask 10 at the same time. For example, when only the first sub-mark 14a is provided on the mask 10, and if the corresponding first mark 34a or a portion of the first mark 34a on the substrate 30 is detected (that is, the first sub-mark 14a is partially shadowed), a defect in shadowing of the first shade 21 is detected. For example, when only the second sub-mark 14b is provided on the mask, if the corresponding first mark 34b or a portion thereof on the substrate 30 is detected (that is, only a portion of the second sub-mark 14b is shadowed), a defect in shadowing of the second shade 22 is detected; for example, when only the third sub-mark 15a is provided on the mask 10, if just a portion of the corresponding second mark 35a is detected on the substrate 30 (that is, the third sub-mark 15a is partially shadowed) or the second mark 35a is not detected on the substrate 30, over-shadowing of the first shade 21 is detected; for example, when only the fourth sub-mark 15b is provided on the mask 10, if just a portion of the corresponding second mark 35b is detected on the substrate (that is, the fourth sub-mark 15b is partially shadowed) or the second mark 35b is not detected on the substrate 30, an defect of over-shadowing of the second shade 22 is detected. And further, except the implementations in which only one detection mark is provided, for example, these four types of detection marks and their setting modes can also be selected and combined so as to adapt to the corresponding detection requirements.

From the above description, it can be seen that the mask according to at least one embodiment of the present disclosure is provided with a first detection mark and/or a second detection mark, and after the processes for the R/G/B/PS of color filter through the mask, if corresponding marks can be detected by optical detection on the substrate of the color filter, the problem of defect in shadowing occurs, and the shadowing effect can be monitored.

Figure 4:
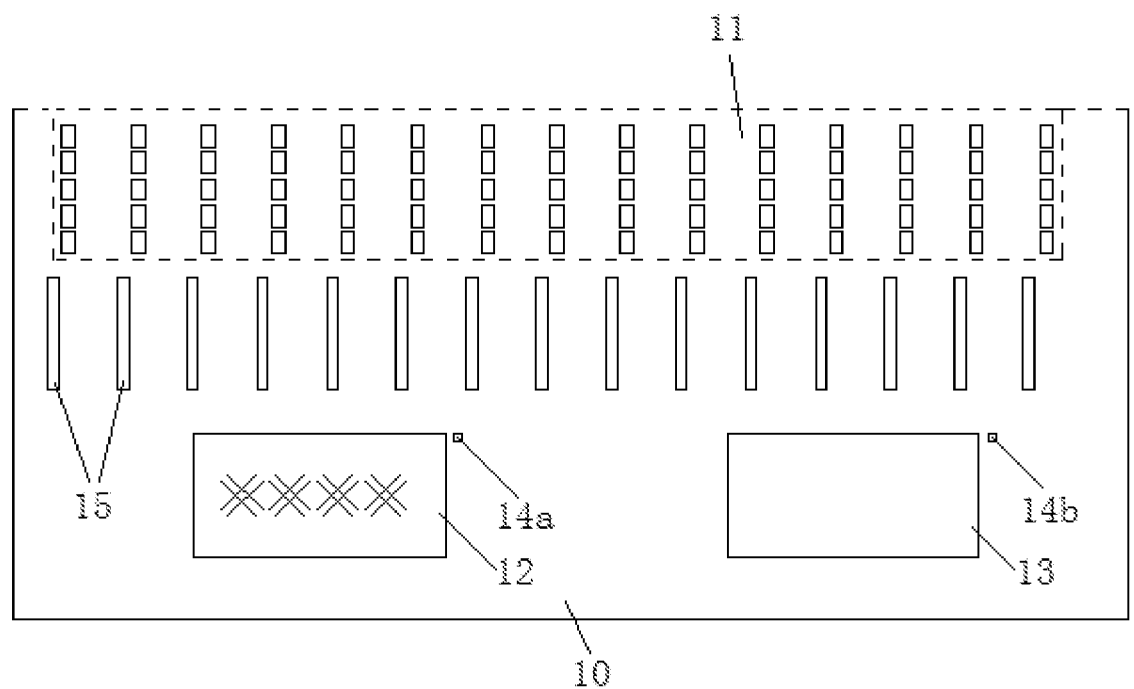
FIG. 4 is a schematic top view of a second example of a mask according to an embodiment of the present disclosure.

At least one embodiment of the present disclosure also provides a second example of a mask that can be configured to monitor occurrences of defect. FIG. 4 is a schematic structural diagram of a second example of a mask according to an embodiment of the present disclosure. In FIG. 4, portions outside the uppermost dashed line refer to other structures of the mask which are not shown, for example, patterns of other portion of the mask which are not illustrated.

In the present example, the mask 10 comprises, for example, an alignment mark window 12 and a gap window 13, and the mask also comprises at least one of the first detection mark 14a/14b and the second detection mark 15, for example.

For example, the first detection mark 14a/14b is flushed with the border of the alignment mark window 12 and/or the gap window 13 adjacent to the interior of the mask 10. For example, the first detection mark comprises a first sub-mark 14a and a second sub-mark 14b; the first sub mark 14a is disposed at a side of the alignment mark window 12; and the second sub-mark 14b is disposed at a side of the gap window 13.

For example, the second detection mark 15 is disposed between the profile 11 of the light transmission area of the mask 10 and the alignment mark window 12, and/or the second detection mark 15 is disposed at the profile 11 of the light transmission area of the mask 10 between and the gap window 13.

For example, as illustrated in FIG. 4, the overall pattern formed by a plurality of second detection marks 15 has a strip shape and have a length greater than the distance between the two side edges of the alignment mark window 12 and the gap window 13 which are away from each other (that is, the distance between the left border of the alignment mark window 12 and the right border of the gap window 13 as illustrated in FIG. 4). For example, the overall pattern of the second detection mark 15 has a strip shape and a length greater than the length of the profile 11 of light transmission area of the mask 10.

For example, the leftmost side of the second detection mark 15 exceeds the left border of the first shade by about 5 mm or more when the first shade 21 normally shadows the alignment mark window 12; for example, the right side edge of the second detection mark 15 exceeds the right edge of the second shade 22 by about 5 mm or more when the second shade 22 normally shadows the gap window 13. For example, if the width of the alignment mark window 12 and the gap window 13 each is about 10 mm and the distance between them is about 20 mm, the length of the second detection mark 15 can be, for example, about 50 mm. Such a configuration ensures that a possible over-shadowing of the shades can be detected.

For example, the width of the second detection mark 15 can be smaller than the distance between a border of the profile 11 of the light transmission area of the mask 10 facing the edge of the alignment mark window 12 and the edge of the alignment mark window 12 facing the profile 11 of the light transmission area. And/or the width of the second detection mark 15 can for example be less than the distance of a border of the profile 11 of the light transmission area of the mask 10 facing the gap window 13 and the edge of the gap window 13 facing the profile 11 of the light transmission area. Such an arrangement ensures that the second detection mark 15 would not shadow other structures that need to be exposed.

For example, in the case where the shade completely shadows the windows, the distance between the upper edge of the shade and the upper edge of the window is, for example, about 2 mm. Therefore, for example, a distance between the lower side of the second detection mark 15 and the alignment mark window 12 or the gap window 13 can be set to about 3 mm. For example, there is a certain gap between the second detection mark 15 and the viewing area (referring to FIGS. 3A-3C). For example, the distance between the second detection mark 15 and the viewing area is about 0.5 mm. In this embodiment, the width of the second detection mark 15 can be adjusted according to the distance between the window and the viewing area and the product demark, for example, the width of the second detection mark 15 is 0.5 to 2 mm, for example, 0.8 mm, 1 mm, 1.5 mm or the like, so that the second detection mark 15 can be better detected in the test of shadowing effect.

The mask according to at least one embodiment of the present disclosure is provided with a first detection mark and/or a second detection mark. After processing for the R/G/B/PS of a color filter is performed through the mask, if corresponding marks can be detected by optical detection on the substrate of the color filter, defect of shadowing effect occurs, thereby monitoring the shadowing effect.

Another embodiment of the present disclosure provides a mask assembly configured to monitor defect, the mask assembly comprising any one of the masks as described above.

Figure 5:
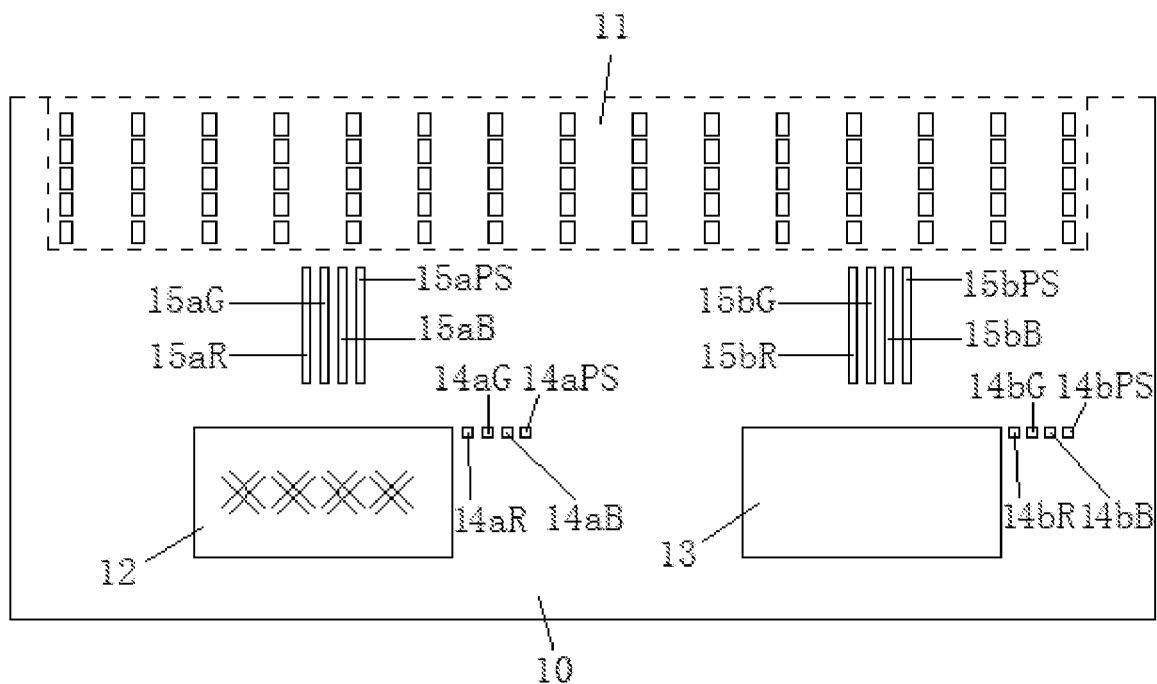
FIG. 5 illustrates a projective top view of a mask assembly according to an embodiment of the present disclosure, wherein four masks of the mask assembly are arranged in a manner as in the first example of the mask and each is provided with four detection marks at different positions, and the four masks are aligned and overlapped.

FIG. 5 is a schematic diagram of a first example of a mask assembly according to an embodiment of the present disclosure, and FIG. 5 illustrates a projective top view of the mask assembly, wherein the mask assembly comprise four masks which are aligned and overlapped, each of the masks provided with four detection marks disposed on different positions in the manners described in the first example of the mask.

In the present example, the mask assembly comprises, for example, four masks 10 according to the first example of the embodiments of the present disclosure. For example, the four masks are masks configured to form a red color layer, a green color layer, a blue color layer, and a spacer, respectively. For example, a first detection mark comprises a first red detection mark, a first green detection mark, a first blue detection mark, and a first spacer detection mark. For example, referring to FIG. 5, the first detection mark is composed of, for example, a first sub-mark 14*a* and a second sub-mark 14*b*. The first sub-mark 14*a* comprises a first red detection mark 14*a*R, a first green detection mark 14*a*G, a first blue detection mark 14*a*B and a first spacer detection mark 14*a*PS, for example. And the second sub-mark 14*b* comprises, for example, a third red detection mark 14*b*R, a third green detection mark 14*b*G, a third blue detection mark 14*b*B, and a third spacer detection mark 14*b*PS.

For example, the first red detection mark 14*a*R, the first green detection mark 14*a*G, the first blue detection mark 14*a*B, and the first spacer detection mark 14*a*PS are respectively disposed on different masks of the mask assembly (for example, the mask assembly comprises 4 masks), and the first red detection mark 14*a*R, the first green detection mark 14*a*G, the first blue detection mark 14*a*B, and the first spacer detection mark 14*a*PS are located on different positions on the respective masks 10. For example, the third red detection mark 14*b*R, the third green detection mark 14*b*G, the third blue detection mark 14*b*B, and the third spacer detection mark 14*b*PS are respectively disposed on different mask 10 of the mask assembly; and the positions of the three red detection mark 14*b*R, the third green detection mark 14*b*G, the third blue detection mark 14*b*B, and the third spacer detection mark 14*b*PS are different on the respective mask 10.

For example, FIG. 5 illustrates a schematic view that the four masks 10 comprising the first red detection mark 14*a*R, the first green detection mark 14*a*G, the first blue detection mark 14*a*B and the first spacer detection mark 14*a*PS, and the third red detection mark 14*b*R, the third green detection mark 14*b*G, the third blue detection mark 14*b*B, and the third spacer detection mark 14*b*PS, respectively, are aligned and overlapped with each other, and each mark is projected onto the same mask 10. For example, the first mask only has the first red detection mark 14*a*R and the third red detection mark 14*b*R, the second mask only has the first green detection mark 14*a*G and the third green detection mark 14*b*G, the third mask has only the first blue detection mark 14*a*B and the third blue detection mark 14*b*B, and the fourth mask only has the first spacer detection mark 14*a*PS and the third spacer detection mark 14*b*PS. After the four masks are aligned and overlapped with each other, the projections of the respective marks on the same mask appear as illustrated in FIG. 5, and the projection positions of each mark are different.

For example, after corresponding manufacturing processes are completed through the masks having different detection marks, it can be determiner whether under-shadowing occurs in a manufacturing process by testing whether a corresponding first mark is formed on a corresponding position on the substrate 30. As the masks corresponding to the respective manufacturing processes have detection marks provided at different positions, if the position of the first mark corresponds to the detection mark at the corresponding position, it can be determined that a defect occurs in the process.

For example, the first mask is provided with the first red mask mark 14*a*R and the third red color flag 14*b*R, and the first mask is configured to perform the preparing process for the red color layer R. For example, the second mask is provided with, for example, the first green detection mark 14*a*G and the third green detection mark 14*b*G, and the second mask is configured to perform the preparing process for the green color layer G. For example, the third mask is provided with a first blue color detection mark 14*a*B and a third blue detection mark 14*b*B, and the third mask is configured to perform the preparing process for the blue color layer B. And for example, the fourth mask can be provided with, a first spacer detection mark 14*a*PS and a third spacer detection mark 14bPS, and the fourth mask is configured to perform the preparing process for the spacer layer PS. After all the preparing processes are completed, the substrate 30 is optically detected. If it is detected that the first mark appears on the substrate 30 at a position corresponding to the first red detection mark 14aR and the third red detection mark 14bR, it can be determined that under-shadowing of the shade occurs in the preparing process for the red color layer. Accordingly, if the first mark appears at a position on the substrate corresponding to other detection marks, it can be determined that defect of under-shadowing occurs in the corresponding preparing process.

The plurality of first detection marks comprised in the mask assembly according to the embodiment of the present disclosure can be configured to monitor possible defects of shadowing in various processes, for example, shadowing effect on the windows in the preparing processes for R/G/B/PS and other processes can be determined be detection.

It should be noted that the positions of the detection marks in the above example can be exchanged with each other as long as the position of each detection mark can be determined so that it can be determined in the subsequent detection step which detection mark left the first mark based on the position of the first mark and it is possible to discriminate which process has a problem of under-shadowing. In addition, for example, the above detection marks can be selected and used according to actual requirements. For example, the mask assembly can be provided with one type of detection mark alone, or different detection marks set in various combinations. The mask assembly can implement detection of under-shadowing of the windows in corresponding preparing process, so as to achieve the purpose of the present disclosure.

In addition, the above example is described by taking the example that the mask assembly has four masks and the positions of the detection marks in each mask are different from each other, and it can be easily conceived that amount of the mask can be appropriately increased or decreased and the positions of marks can also be exchanged with each other when facing different requirements. These variations should also belong to the protection scope of the present disclosure.

For example, in another example, with continued reference to FIG. 5, the second detection mark can comprise, for example, a second red detection mark, a second green detection mark, a second blue detection mark, and a second spacer detection mark; for example, referring to FIG. 5, the second detection mark can be composed of a third sub-mark 15a and a fourth sub-mark 15b, and the third sub-mark 15a can comprise a second red detection mark 15aR, a second green detection mark 15aG, and a second blue detection mark 15aB and the second spacer detection mark 15aPS; for example, the fourth sub mark 15b may comprise the fourth red detection mark 15bR, the fourth green detection mark 15bG, the fourth blue detection mark 15bB, and the fourth spacer detection mark 15bPS.

For example, the second red detection mark 15aR, the second green detection mark 15aG, the second blue detection mark 15aB, and the second spacer detection mark 15aPS are respectively disposed in different masks of the mask assembly (for example, four masks are comprised in the mask assembly), and the second red detection mark 15aR, the second green detection mark 15aG, the second blue detection mark 15aB, and the second spacer detection mark 15aPS are positioned at different positions in the respective mask 10. For example, the fourth red detection mark 15bR, the fourth green detection mark 15bG, the fourth blue detection mark 15bB, and the fourth spacer detection mark 15bPS are respectively disposed on different masks 10 of the mask assembly; and positions of the fourth red detection marks 15bR, the fourth green detection marks 15bG, the fourth blue detection marks 15bB, and the fourth spacer detection marks 15bPS are different on the respective mask 10.

For example, FIG. 5 illustrates a schematic view that the four masks 10 comprising the second red detection mark 15aR, the second green detection mark 15aG, the second blue detection mark 15aB and the second spacer detection mark 15aPS, and the fourth red detection mark 15bR, the fourth green detection mark 15bG, the fourth blue detection mark 15bB, and the fourth spacer detection mark 15bPS, respectively, are aligned and overlapped with each other, and each mark is projected onto the same mask 10. For example, the first mask only has the second red detection mark 15aR and the fourth red detection mark 15bR, the second mask only has the second green detection mark 15aG and the fourth green detection mark 15bG, the third mask has only the second blue detection mark 15aB and the fourth blue detection mark 15bB, and the fourth mask only has the second spacer detection mark 15aPS and the fourth spacer detection mark 15bPS. After the four masks are aligned and overlapped with each other, the projections of the respective marks on the same mask appear as illustrated in FIG. 5, and the projection positions of each mark are different.

For example, after corresponding manufacturing processes are completed through the masks having different detection marks, it can be determiner whether over-shadowing occurs in a manufacturing process by testing whether a corresponding second mark does not appears on a corresponding position on the substrate 30 or only a portion of the corresponding second mark appears on a corresponding position on the substrate 30. As the masks corresponding to the respective manufacturing processes have detection marks provided at different positions, if the position of the second mark corresponds to the detection mark at the corresponding position, it can be determined that a defect occurs in the process.

For example, the first mask is provided with the second red mask mark 15aR and the fourth red color flag 15bR, and the first mask is configured to perform the preparing process for the red color layer R. For example, the second mask is provided with, for example, the second green detection mark 15aG and the fourth green detection mark 15bG, and the second mask is configured to be used to perform the preparing process for the green color layer G. For example, the third mask is provided with a second blue color detection mark 15aB and a fourth blue detection mark 15bB, and the third mask is configured to perform the preparing process for the blue color layer B. And for example, the fourth mask can be provided with, a second spacer detection mark 15aPS and a fourth spacer detection mark 15bPS, and the fourth mask is configured to perform the preparing process for the spacer layer PS. After all the preparing processes are completed, the substrate 30 is optically detected. If it is detected that the second mark does not appears or only a portion of the second mark appears on the substrate 30 at a position corresponding to the second red detection mark 15aR and the fourth red detection mark 15bR, it can be determined that over-shadowing of the shade occurs in the preparing process for the red color layer. Accordingly, if the second mark does not appear or only a portion of the second mark appears at a position on the substrate corresponding to other detection marks, it can be determined that defect of over-shadowing occurs in the corresponding preparing process.

A plurality of second detection marks provided in the mask assembly according to the embodiment of the present disclosure can be configured to monitor defects of shadowing in each process, for example, it can detect the shielding effect on a window in preparing processes for R/G/B/PS and the like.

It should be noted that the positions of the detection marks in the above example can be exchanged with each other as long as the position of each detection mark can be determined so that it can be determined in the subsequent detection step which detection mark is shadowed such that no second mark is left or only a portion of the second mark is left through whether the second mark appears or only a portion of the second mark appears, so that it can be distinguished which process has the problem of over-shadowing by the shade. In addition, for example, the above detection marks can be selected and used according to actual needs. For example, the mask assembly can be provided with one type of detection mark alone, or different detection marks can be provided in various combinations. The mask assembly can be configured to detect over-shadowing on window in corresponding processes so as to achieve the purpose of the present disclosure.

In addition, the above example is described by taking the example that the mask assembly has four masks and positions of the marks on the respective masks are different. It can be easily imagined that the amount of the masks can be increased or decreased properly and the mark positions can also be exchanged with each other. These variants should also fall within the protection scope of the present disclosure.

In addition, it should be noted that the first detection mark and the second detection mark in the above example can be separately disposed on different masks according to different requirements, and such modified examples should also belong to the protection scope of the present disclosure.

In the present embodiment, one example of the mask assembly comprises only a plurality of masks according to the first example of the embodiments of the present disclosure, and another example of the mask assembly comprises only a plurality of the masks according to the second example of the embodiments of the present disclosure. However, it can be known that the mask assembly can also comprise the combination of the masks in the first example and the second example of the mask according to the embodiments of the present disclosure, that is, the mask assembly comprises both the masks in the first example and in the second example, and the number of the two masks in the mask assembly can also be selected according to actual requirements. The above changes should also fall within the protection scope of the present disclosure.

At least one embodiment of the present disclosure further provides a mask assembly that can be configured to monitor an occurrence of defect, the mask assembly comprising any of the masks according to embodiments of the present disclosure.

Figure 6:
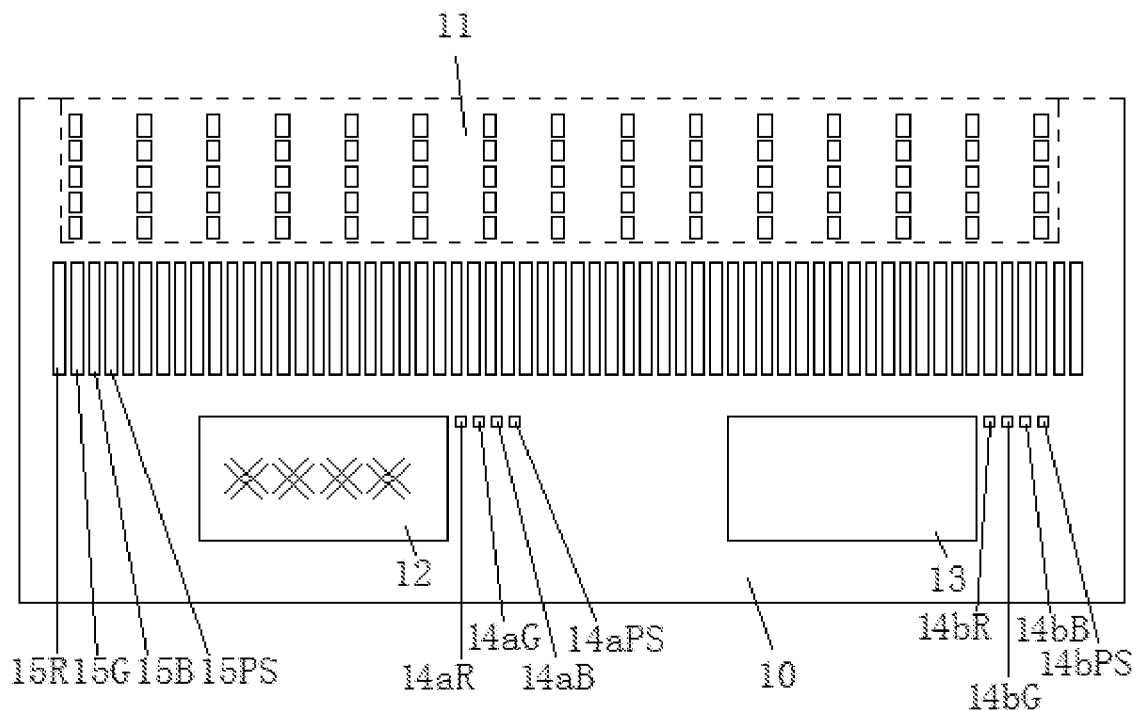
FIG. 6 illustrates a projective top view of a mask assembly according to an embodiment of the present disclosure, wherein four masks of the mask assembly are arranged in a manner as in the second example of the mask and each is provided with four detection marks at different positions, and the four masks are aligned and overlapped.

FIG. 6 is a schematic diagram of a second example of a mask assembly according to an embodiment of the present disclosure, and FIG. 6 is a projective schematic plan view of four masks of a mask assembly, wherein four detection marks of the masks are disposed on different positions in a manner that the detection marks in the second example of the mask are disposed and the four masks are aligned and overlapped.

In the present embodiment, the mask assembly can comprise, for example, four mask plates 10 according to the second example of the embodiments of the present disclosure.

For example, the first detection mark of the mask can comprise a first red detection mark, a first green detection mark, a first blue detection mark, and a first spacer detection mark. For example, referring to FIG. 5, the first detection mark can be composed of, for example, a first sub-mark 14$a$ and a second sub-mark 14$b$, and the first sub-mark 14$a$ can comprise, for example, a first red detection mark 14$a$R, a first green detection mark 14$a$G, a first blue detection mark 14$a$B and a first spacer detection mark 14$a$PS, and the second sub-mark 14$b$ can comprise, for example, a third red detection mark 14$b$R, a third green detection mark 14$b$G, a third blue detection mark 14$b$B, and a third spacer detection mark 14$b$PS.

For example, the first red detection mark 14$a$R, the first green detection mark 14$a$G, the first blue detection mark 14$a$B and the first spacer detection mark 14$a$PS are respectively disposed on different masks of the mask assembly (for example, the mask plate assembly comprises 4 masks); and the first red detection mark 14$a$R, the first green detection mark 14$a$G, the first blue detection mark 14$a$B, and the first spacer detection mark 14$a$PS are disposed on different positions on the respective mask 10. For example, the third red detection mark 14$b$R, the third green detection mark 14$b$G, the third blue detection mark 14$b$B, and the third spacer detection mark 14$b$PS are respectively disposed on different masks 10 of the mask assembly; and the positions of the three red detection mark 14$b$R, the third green detection mark 14$b$G, the third blue detection mark 14$b$B, and the third spacer detection mark 14$b$PS are different on the respective mask 10.

It should be noted that the positions of the detection marks in the above example can be exchanged with each other as long as the position of each detection mark can be determined so that it can be determined in the subsequent detection step which detection mark left the first mark based on the position of the first mark and it is possible to discriminate which process has a problem of under-shadowing. In addition, for example, the above detection marks can be selected and used according to actual requirements. For example, the mask assembly can be provided with one type of detection mark alone, or different detection marks set in various combinations. The mask assembly can implement detection of under-shadowing of the windows in corresponding preparing process, so as to achieve the purpose of the present disclosure.

For example, the second detection mark can comprise, for example, a second red detection mark, a second green detection mark, a second blue detection mark, and a second spacer detection mark; for example, referring to FIG. 5, the second detection mark can be composed of a third sub-mark 15$a$ and a fourth sub-mark 15$b$, and the third sub-mark 15$a$ can comprise, for example, a second red detection mark 15$a$R, a second green detection mark 15$a$G, and a second blue detection mark 15$a$B and the second spacer detection mark 15$a$PS; for example, the fourth sub mark 15$b$ can comprise the fourth red detection mark 15$b$R, the fourth green detection mark 15$b$G, the fourth blue detection mark 15$b$B, and the fourth spacer detection mark 15$b$PS.

For example, the second red detection mark 15$a$R, the second green detection mark 15$a$G, the second blue detection mark 15$a$B, and the second spacer detection mark 15$a$PS are respectively disposed in different masks of the mask assembly (for example, four masks are comprised in the mask assembly), and the second red detection mark 15aR, the second green detection mark 15aG, the second blue detection mark 15aB, and the second spacer detection mark 15aPS are positioned at different positions in the respective mask 10. For example, the fourth red detection mark 15bR, the fourth green detection mark 15bG, the fourth blue detection mark 15bB, and the fourth spacer detection mark 15bPS are respectively disposed on different masks 10 of the mask assembly; and positions of the fourth red detection marks 15bR, the fourth green detection marks 15bG, the fourth blue detection marks 15bB, and the fourth spacer detection marks 15bPS are different on the respective mask 10.

It should be noted that the positions of the detection marks in the above example can be exchanged with each other as long as the position of each detection mark can be determined so that it can be determined in the subsequent detection step which detection mark is shadowed such that no second mark is left or only a portion of the second mark is left through whether the second mark appears or only a portion of the second mark appears, so that it can be distinguished which process has the problem of over-shadowing by the shade. In addition, for example, the above detection marks can be selected and used according to actual needs. For example, the mask assembly can be provided with one type of detection mark alone, or different detection marks can be provided in various combinations. The mask assembly can be configured to detect over-shadowing on window in corresponding processes so as to achieve the purpose of the present disclosure.

For example, the number of the second red detection mark 15R, the second green detection mark 15G, the second blue detection mark 15B, and the second spacer detection mark 15PS can each be plural.

For example, the plurality of second red detection marks 15R can be arranged at equal intervals, and the distance between the two farthest second red detection marks 15R is greater than the distance between the two side edges of the alignment mark window 12 and the gap window 13 which are away from each other.

For example, the plurality of second green detection marks 15G can be arranged at equal intervals, and the distance between the two farthest second green detection marks 15G is greater than the distance between the two side edges of the alignment mark window 12 and the gap window 13 which are away from each other.

For example, the plurality of second blue detection marks 15B can be arranged at equal intervals, and the distance between the two farthest second green detection marks 15B is greater than the distance between the two side edges of the alignment mark window 12 and the gap window 13 which are away from each other.

For example, the plurality of second spacer detection mark 15PS can be arranged at equal intervals, and the distance between the two farthest second spacer detection mark 15PS is greater than the distance between the two side edges of the alignment mark window 12 and the gap window 13 which are away from each other.

For example, FIG. 6 illustrates a schematic view that the four masks 10 each comprising the second red detection mark 15R, the second green detection mark 15G, the second blue detection mark 15B and the second spacer detection mark 15PS, are aligned and overlapped with each other, and each mark is projected onto the same mask 10. For example, the first mask only has the plurality of second red detection marks 15R arranged at equal intervals, the second mask only has the plurality of second green detection marks 15G arranged at equal intervals, the third mask only has the plurality of second blue detection marks 15B arranged at equal intervals, and the fourth mask only has the plurality of second spacer detection mark 15PS. After the four masks are aligned and overlapped, the projections of the respective marks on the same mask appear as illustrated in FIG. 6, and the projection positions of each mark are different.

For example, after corresponding manufacturing processes are completed through the masks having different detection marks, it can be determiner whether over-shadowing occurs in a manufacturing process by testing whether a corresponding second mark does not appears on a corresponding position on the substrate 30 or only a portion of the corresponding second mark appears on a corresponding position on the substrate 30. As the masks corresponding to the respective manufacturing processes have detection marks provided at different positions, if the position of the second mark corresponds to the detection mark at the corresponding position, it can be determined that a defect occurs in the process.

For example, the first mask is provided with the second red mask mark 15R, and the first mask is configured to perform the preparing process for the red color layer R. For example, the second mask is provided with the second green detection mark 15G, and the second mask is configured to perform the preparing process for the green color layer G. For example, the third mask is provided with a second blue color detection mark 15B, and the third mask is configured to perform the preparing process for the blue color layer B. And for example, the fourth mask can be provided with a second spacer detection mark 15PS, and the fourth mask is configured to perform the preparing process for the spacer layer PS. After all the preparing processes are completed, the substrate 30 is optically detected. If it is detected that the second mark does not appears or only a portion of the second mark appears on the substrate 30 at a position corresponding to the second red detection mark 15R, it can be determined that over-shadowing of the shade occurs in the preparing process for the red color layer. Accordingly, if the second mark does not appear or only a portion of the second mark appears at a position on the substrate corresponding to other detection marks, it can be determined that defect of over-shadowing occurs in the corresponding preparing process. The plurality of second detection marks 15 comprised in the mask assembly according to the embodiment can test the shadowing effect on the window in the preparing processes for R/G/B/PS and the like. And at the same time, as the second detection mark 15 are long enough, it can be configured to detect shift of the shade in the direction from the left to the right in some degree besides detecting over-shadowing.

The first detection mark and the second detection mark used in the mask assembly according to the embodiment of the present disclosure can be configured to monitor defects of shadowing in each process. For example, the first detection mark and the second detection mark can be used to detect shadowing effect on windows in preparing processes for R/G/B/PS and the like.

In addition, the above example is described by taking the example that the mask assembly has four masks and positions of the detection marks in the respective masks are different. It can be easily imagined that the amount of the masks can be increased or decreased appropriately, and the mark positions can also be exchanged with each other. These variants should also fall within the protection scope of the present disclosure.

In addition, it should also be noted that the first detection mark and the second detection mark in the above example can be separately disposed on different masks according to different requirements, and such modified examples should also belong to the protection scope of the present disclosure.

Figure 7:
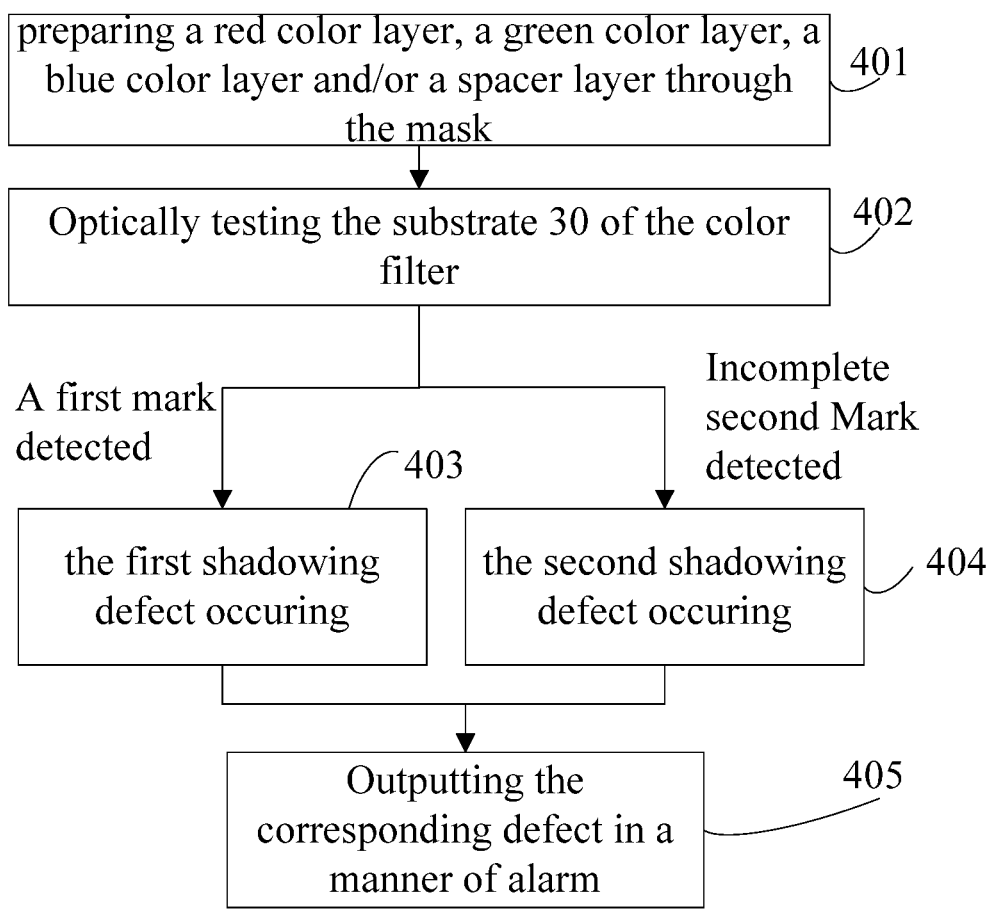
FIG. 7 is a schematic flowchart of an example of a method for testing a shadowing effect on a test window through a mask according to an embodiment of the present disclosure.

At least one embodiment of the present disclosure further provides a method capable of monitoring shadowing effect on a detection window, which adopts a mask according to ally one of the above embodiments or a mask assembly according to any one of the above embodiments. FIG. 7 is a schematic flowchart of all example of a method for testing a shadowing effect on a test window through a mask or a mask assembly according to an embodiment of the present disclosure.

For example, the method for testing shadowing effect on a window can comprise the following steps:

Step 401: preparing a red color layer R, a green color layer G, a blue color layer B and/or a spacer layer PS through the mask 10 or the mask assembly;

Step 402: Optically testing the substrate 30 of the color filter;

Step 403: if a first mark formed on the substrate 30 of the color filter due to the first detection mark is detected, it is determined that the first shadowing defect occurs (that is, under-shadowing); and/or Step 404: If it is detected that the second mark formed on the substrate 30 of the color filter due to the second detection mark is an incomplete second detection mark pattern (for example, there is no second mark at all or there is only a part of the second mark), it is determined that the second shadowing defect occurs (that is, over-shadowing);

Step 405: Outputting the corresponding defect in a manner of alarm.

The method for testing the shadowing effect on the window according to the embodiment of the present disclosure performs exposure by using the mask or the mask assembly according to any one of the above embodiments, and when a defect in shadowing occurs, the defect can be monitored based on the marks formed on the substrate. Thus, defect in shadowing by the shade can be spotted in time, and eventually the defective product can be avoided.

It should be noted that, when the structure of the mask used in the above example is different, the steps of the method can be modified accordingly. For example, if the mask is only provided with a first detection mark, only the first mark needs to be detected; for example, if the mask is provided with both the first detection mark and the second detection mark, only the first mark or the second mark can be detected. Second mark. In this embodiment, the steps of the method can be selected based on actual conditions, and therefore the protection scope of the present disclosure should not be limited to a specific embodiment. Any reasonably deducible embodiment should belong to the protection scope of the present disclosure.

For example, AOI (Automatic Optic Inspection) can be adopted for optical inspection. For example, the AOI is configured to detect the first mark and/or the second mark, the AOI is accurate and rapid, so that the inspecting personnel can spot the problem when monitoring the AOI.

At least one embodiment of the present disclosure further provides an exposure machine that can be configured to monitor the occurrence of a defect. The exposure machine employs the mask or the mask assembly according to any one of the above embodiments, thereby exposing the photoresist layer in the photolithography process.

The exposure machine according to at least one embodiment of the present disclosure adopts the mask or the mask assembly according to any one of the above embodiments to perform the exposure, and therefore the shadowing effect can be monitored through the first detection mark and/or the second detection provided on the mask. For example, when the mask is used to perform the preparing processes for R/G/B/PS processing of a color filter, if a corresponding mark on the substrate of the color filter is detected by optical inspection, it means that defect in shadowing effect occurs, thus monitoring the shadowing effect.

At least one embodiment of the present disclosure provides a photolithography method. The method comprises an exposing process. The exposing process adopts any one of the masks mentioned above or any one of the mask assemblies mentioned above to perform the exposure. Therefore, the method can be used to monitor the shadowing effect through the first detection mark and/or the second detection mark provided on the mask. For example, the method can be used to prepare patterns of various functional layer of a display panel. For example, after performing the preparing processes for R/G/B/PS of a color filter through the method, if a corresponding mark on the substrate of the color filter can be detected through an optical inspection, it means occurrence of defect in shadowing effect, thus monitoring the shadowing effect.

The following points need to be explained:

(1) The drawings of the embodiments of the present disclosure relate only to the structures involved in the embodiments of the present disclosure, and other structures can be referred to normal demarks.

(2) For the sake of clarity, in the drawings depicting embodiments of the present disclosure, the thicknesses of layers or regions are enlarged or reduced, that is, these drawings are not drawn to actual scale. It will be understood that when an element such as a layer, film, region, or substrate is referred to as being "on" or "under" another element, it can be directly "on" or "below" of another element. Or there can be intermediate elements.

In the case of no conflict, the embodiments of the present disclosure and the features in the embodiments can be combined with each other to obtain a new embodiment.

The foregoing are merely exemplary embodiments of the disclosure, but are not used to limit the protection scope of the disclosure. The protection scope of the disclosure shall be defined by the attached claims.

The present disclosure claims priority of Chinese Patent Application No. 201710326143.5 filed on May 10, 2017, the disclosure of which is hereby entirely incorporated by reference as a part of the present disclosure.

The invention claimed is:

1. A mask, comprising:
    a light transmission area;
    a functional window comprising at least one of an alignment mark window and a gap window, provided at a side of the light transmission area; and
    a first detection mark and a second detection mark;
    wherein the first detection mark is flushed with a border of the functional window adjacent to an interior of the mask;
    the second detection mark is disposed between the profile of the light transmission area and the functional window;
    the first detection mark comprises a first sub-mark and a second sub-mark;
    the first sub-mark is disposed at a side of the alignment mark window; and the second sub-mark is disposed at a side of the gap window.

2. The mask according to claim 1, wherein the second detection mark comprises a third sub-mark and a fourth sub-mark;
the third sub-mark is disposed between a profile of the light transmission area and the alignment mark window; and
the fourth sub-mark is disposed between a profile of the light transmission area and the gap window.

3. The mask according to claim 1, wherein the mask comprises a plurality of second detection marks, an overall pattern formed by the plurality of second detection marks has a strip shape and has a length greater than the distance between the two side edges of the alignment mark window and the gap window which are away from each other.

4. The mask according to claim 3, wherein a width of the overall pattern formed by the plurality of second detection marks is less than a distance of a border of the profile of the light transmission area of the mask facing the edge of the alignment mark window and an edge of the alignment mark window facing the profile of the light transmission area, and/or, a width of the overall pattern formed by the plurality of second detection marks is less than a distance of a border of the profile of the light transmission area of the mask facing the gap window and an edge of the gap window facing the profile of the light transmission area.

5. The mask according to claim 1, wherein the mask comprises a plurality of second detection marks, an overall pattern formed by the plurality of second detection marks has a strip shape and has a length greater than a length of the profile of the light transmission area.

6. An exposure machine, adopting the mask according to claim 1.

7. A photolithography method, comprising an exposing process, in which an exposure is performed through the mask according to claim 1.

8. A mask assembly, comprising a plurality of masks, wherein each mask comprises:
a light transmission area;
a functional window comprising at least one of an alignment mark window and a gap window, provided at a side of the light transmission area; and
a first detection mark and a second detection mark;
wherein the first detection mark is flushed with a border of the functional window adjacent to an interior of the mask;
the second detection mark is disposed between the profile of the light transmission area and the functional window;
the first detection mark comprises a first sub-mark and a second sub-mark;
the first sub-mark is disposed at a side of the alignment mark window; and
the second sub-mark is disposed at a side of the gap window.

9. The mask assembly according to claim 8, wherein
the plurality of the masks comprises two, three or four masks for respectively forming two, three or four of a red color layer, a green color layer, a blue color layer and a spacer;
the first detection marks comprises two, three or four of a first red detection mark, a first green detection mark, a first blue detection mark and a first spacer detection mark;
the two, the three or the four of the first red detection mark, the first green detection mark, the first blue detection mark and the first spacer detection mark are disposed on different masks of the mask assembly, respectively; and
positions of the two, the three or the four of the first red detection mark, the first green detection mark, the first blue detection mark and the first spacer detection mark on the respective masks are different.

10. The mask assembly according to claim 8, wherein
the second detection mark of the plurality of the masks comprises two, three or four of a second red detection mark, a second green detection mark, a second blue detection mark, and a second spacer detection mark;
the two, the three or the four of the second red detection mark, the second green detection mark, the second blue detection mark, and the second spacer detection mark are respectively disposed on different masks of the mask assembly; and
positions of the two, the three or the four of the second red detection mark, the second green detection mark, the second blue detection mark and the second spacer detection mark on the respective masks are different.

11. The mask assembly according to claim 10, wherein a number of each of the two, the three or the four of the second red detection mark, the second green detection mark, the second blue detection mark, and the second spacer detection mark are plural.

12. The mask assembly according to claim 11, wherein
the plurality of second red detection marks are arranged at equal intervals, and a distance between the two farthest second red detection marks is greater than a distance between the two side edges of the alignment mark window and the gap window which are away from each other;
the plurality of second green detection marks are arranged at equal intervals, and a distance between the two farthest second green detection marks is greater than the distance between the two side edges of the alignment mark window and the gap window which are away from each other;
the plurality of second blue detection marks are arranged at equal intervals, and a distance between the two farthest second green detection marks is greater than the distance between the two side edges of the alignment mark window and the gap window which are away from each other; and
the plurality of second spacer detection mark are arranged at equal intervals, and a distance between the two farthest second spacer detection mark is greater than the distance between the two side edges of the alignment mark window and the gap window which are away from each other.

13. A method for testing shadowing effect on a window through the mask according to claim 8, comprising:
optically inspecting a substrate to determine whether a first mark or a second mark is formed on the substrate by the first detection mark or the second detection mark.

14. A method for testing shadowing effect on a window through a mask, wherein the mask comprises:
a light transmission area;
a functional window comprising at least one of an alignment mark window and a gap window, provided at a side of the light transmission area; and
a first detection mark and a second detection mark:
wherein the first detection mark is flushed with a border of the functional window adjacent to an interior of the mask;

the second detection mark is disposed between the profile of the light transmission area and the functional window:

the first detection mark comprises a first sub-mark and a second sub-mark:

the first sub-mark is disposed at a side of the alignment mark window: and the second sub-mark is disposed at a side of the gap window, wherein the method comprises:

optically inspecting a substrate to determine whether a first mark or a second mark is formed on the substrate by the first detection mark or the second detection mark.

15. The method for testing shadowing effect on the window according to claim 14, wherein when the first mark is formed on the substrate by the first detection mark, it is determined that a first shadowing defect occurs; and when the second mark formed on a substrate of a color filter by the second detection mark is incomplete, it is determined that a second shadowing defect occurs.

16. The method for testing shadowing effect on the window according to claim 14, further comprising:

preparing one or more of a red color layer, a green color layer, a blue color layer and a spacer layer of the color filter through the mask or a mask assembly; and performing an optical inspection on the substrate of the color filter.

17. The method for testing shadowing effect on the window according to claim 14, wherein the optical inspection is automatic optical inspection.

* * * * *